(12) United States Patent
Anderson et al.

(10) Patent No.: US 7,902,625 B2
(45) Date of Patent: Mar. 8, 2011

(54) METAL-GATE THERMOCOUPLE

(75) Inventors: Brent A. Anderson, Jericho, VT (US);
Andres Bryant, Burlington, VT (US);
Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 274 days.

(21) Appl. No.: 12/106,557

(22) Filed: Apr. 21, 2008

(65) Prior Publication Data

US 2009/0260669 A1    Oct. 22, 2009

(51) Int. Cl.
*H01L 31/058*    (2006.01)

(52) U.S. Cl. .................... 257/467; 257/E23.08; 136/233

(58) Field of Classification Search ............. 257/E23.08, 257/467; 136/233; 438/50
See application file for complete search history.

(56) References Cited

U.S. PATENT DOCUMENTS

| | | | |
|---|---|---|---|
| 5,156,688 A * | 10/1992 | Buhler et al. ................. | 136/211 |
| 5,795,069 A | 8/1998 | Mattes et al. | |
| 5,909,004 A | 6/1999 | Hedengren et al. | |
| 6,039,834 A | 3/2000 | Tanaka et al. | |
| 6,190,040 B1 | 2/2001 | Renken et al. | |
| 6,203,191 B1 | 3/2001 | Mongan | |
| 6,271,148 B1 | 8/2001 | Kao et al. | |
| 6,300,554 B1 | 10/2001 | Du et al. | |
| 6,303,976 B1 | 10/2001 | Gaitan et al. | |
| 6,630,754 B1 | 10/2003 | Pippin | |
| 6,664,186 B1 | 12/2003 | Callegari et al. | |
| 6,828,172 B2 * | 12/2004 | Chavan et al. .................. | 438/50 |
| 2001/0000852 A1 * | 5/2001 | Mauze et al. ............. | 73/335.06 |

* cited by examiner

*Primary Examiner* — Davienne Monbleau
*Assistant Examiner* — Matthew Reames
(74) *Attorney, Agent, or Firm* — David Cain; Roberts Mlotkowski Safran & Cole, P.C.

(57) ABSTRACT

A metal gate thermocouple is provided. The thermocouple is configured to measure local temperatures of a device. The thermocouple is a passive device which senses temperature using the thermoelectric principle that when two dissimilar electrically conductive materials are joined, an electrical potential (voltage) is developed between the two materials. The voltage between the materials varies with the temperature of the junction (joint) between the materials. The thermocouple device includes a first conductor comprising a first material formed over a thin oxide layer or a shallow trench isolation (STI) structure and a second conductor comprising a second material formed over the thin oxide layer or the STI structure. The second conductor overlaps with the first conductor to form a thermocouple junction or dimension at least more than an alignment tolerance. The first and second materials are chosen such that the thermocouple junction formed between them exhibits a non-zero Seebeck coefficient. A conductive film formed over the first conductor and the second conductor and a non-conductive void or film is formed over the thermocouple junction.

1 Claim, 2 Drawing Sheets

METAL-GATE THERMOCOUPLE

FIELD OF THE INVENTION

The invention relates to a semiconductor structure, and more particularly to a metal gate thermocouple.

BACKGROUND DESCRIPTION

Conventional temperature transducers include resistance-temperature detectors, thermistors, thermocouples, and integrated sensors. The thermocouple is a passive device which senses temperature using known thermoelectric principles. Thermocouples provide approximately linear changes in voltage corresponding to small changes in temperature.

Conventional thermocouples are generally fabricated by welding two dissimilar wires. Using conventional thermocouples to measure temperature gradients across a large area involves the fabrication of a thermocouple array connected to a voltmeter with a sequential scanner.

SUMMARY

In a first aspect of the invention, an integrated circuit comprises at least one thermocouple. The at least one thermocouple comprises a first conductor formed over a thin oxide layer or a shallow trench isolation (STI) structure; a second conductor formed over the thin oxide layer or the STI structure, the second conductor overlapping with the first conductor to form a thermocouple junction which is at least more than an alignment tolerance; and a conductive film formed over the first conductor and the second conductor and a non-conductive void or film formed over the thermocouple junction and extending beyond the thermocouple junction to edges of the first conductor and the second conductor by at least the alignment tolerance.

In embodiments, the first and second conductors are dissimilar metals. The film comprises polysilicon and the conductive film is doped polysilicon. The polysilicon covers the thermocouple junction and is nearly intrinsic above the junction. The film comprises aluminum or an aluminum alloy, and does not cover the thermocouple junction.

The integrated circuit further comprises a semiconductor disposed above at least a portion of the first and second conductors. The thermocouple junction has an overlying substantially non-conduction region and the integrated circuit includes NFETS and PFETS comprising first type metal gates and second type metal gates, respectively. The at least one thermocouple is two thermocouples in series connect to a measuring device.

DETAILED DESCRIPTION

The invention relates to a semiconductor structure and more particularly to a metal gate thermocouple. More specifically, the present invention relates to a thermocouple configured to measure local temperatures of a device. In accordance with the invention, the thermocouple is a passive device which senses temperature using the thermoelectric principle that when two dissimilar electrically conductive materials are joined, an electrical potential (voltage) is developed between the two materials. The voltage between the materials varies with the temperature of the junction (joint) between the materials.

Figure 1:
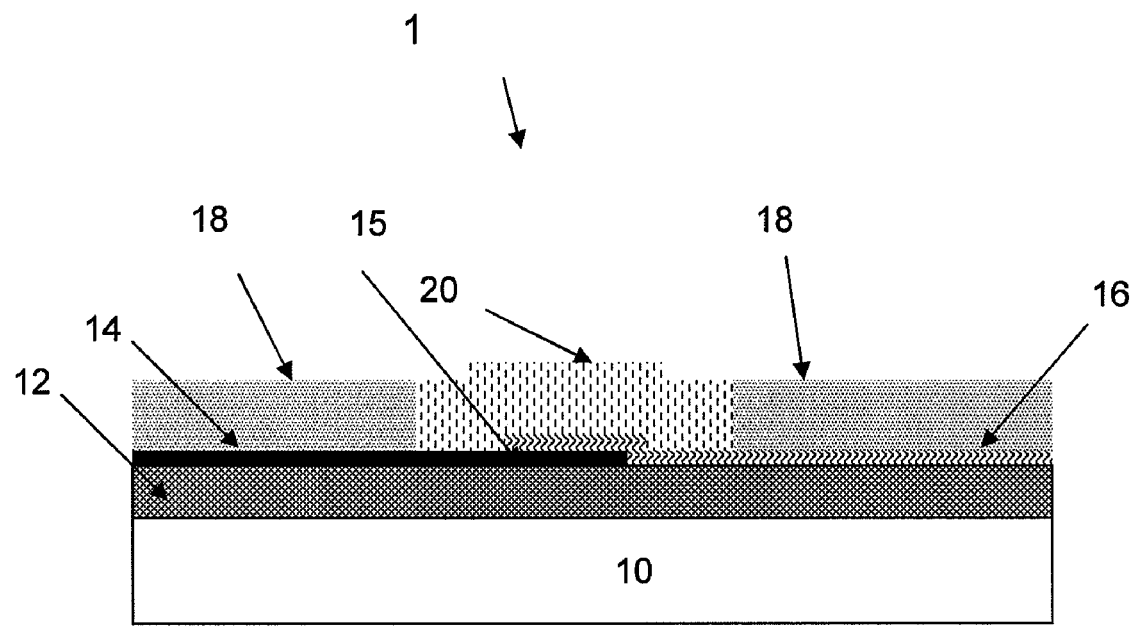
FIG. 1 shows a metal gate thermocouple in accordance with a first aspect of the invention.

More specifically, FIG. 1 shows a first aspect of the thermocouple in accordance with the present invention. The thermocouple is generally shown at reference numeral 1. In embodiments, the thermocouple 1 can be fabricated using BULK or SOI technology. In one aspect of the invention, the thermocouple 1 is fabricated on a thin oxide layer 12. The thin oxide layer 12 is deposited on silicon 10. In another embodiment, the thermocouple 1 is fabricated on a conventionally formed shallow trench isolation (STI) structure, formed in silicon 10. Accordingly, reference numeral 12 can equally depict a thin oxide layer or an STI structure.

Still referring to FIG. 1, a first (conductor) metal layer 14 is deposited on the layer 12. The first metal layer 14 may be, for example, Tantalum Nitride, Titanium Nitride, Tungsten, or Aluminum Titanium Nitride. The first metal layer 14 may also be doped with other metals such as, for example, magnesium, arsenic or boron, to shift the work function of the metal. The first metal layer 14 may also be a doped polysilicon or any type conductor. The first metal layer 14 may be about 5 nm to 50 nm in thickness.

A second metal (conductor) layer 16 is deposited on the layer 12 and overlaps with the metal layer 14. The overlap between the first metal layer 14 and the second metal layer 16 results in a thermocouple junction 15. In embodiments, the thermocouple junction 15 is at least more than an alignment tolerance. For example, in embodiments, the thermocouple junction 15 (e.g., overlap of the first metal layer 14 and the second metal layer 16) is about 2 nm; although this junction may be upwards of 500 nm, in certain embodiments. The result of a larger junction is a lower noise measurement, but the necessity for a larger power requirement.

The second metal layer 16 may be, for example, Tantalum Nitride, Titanium Nitride, Tungsten, or Aluminum Titanium Nitride. The second metal layer 16 may also be doped with other metals such as, for example, magnesium, arsenic or boron, to shift the work function of the metal. The second metal layer 16 may also be a doped polysilicon or any type conductor. The second metal layer 16 may be about 5 nm to 50 nm in thickness. The metal layer 14 and the second metal layer 16 should not be the same metals, when deposited on the structure of the present invention, e.g., the junction formed by the two metals should have a non-zero Seebeck coefficient.

In further embodiments, a polysilicon layer 18 is deposited over the first metal layer 14 and the second metal layer 16 in a conventional manner. For example, the polysilicon layer 18 may be deposited using conventional chemical vapor deposition (CVD) processes or plasma enhanced CVD processes (PECVD). In embodiments, using conventional masking processes over the thermocouple junction 15, the polysilicon layer 18 may be doped using conventional dopants. For example, the polysilicon layer 18 can be doped with arsenic on an NFET side of the device and boron on a PFET side of the device. The thickness of the polysilicon layer 18 is about 15 nm to 300 nm.

As shown in FIG. 1, the polysilicon layer over the thermocouple junction 15 remains undoped and is designated with reference numeral 20. That is, in embodiments, the polysilicon layer 20 is non-conductive over the thermocouple junction 15. In further embodiments, the undoped polysilicon layer 20 extends past the thermocouple junction 15 by a distance of about 2 nm to 500 nm. Said otherwise, the distance between the doped polysilicon layer 18 and an edge of the thermocouple junction 15 (on both sides) is about 2 nm to 500 nm. A device may be formed over the structure of FIG. 1.

Figure 2:
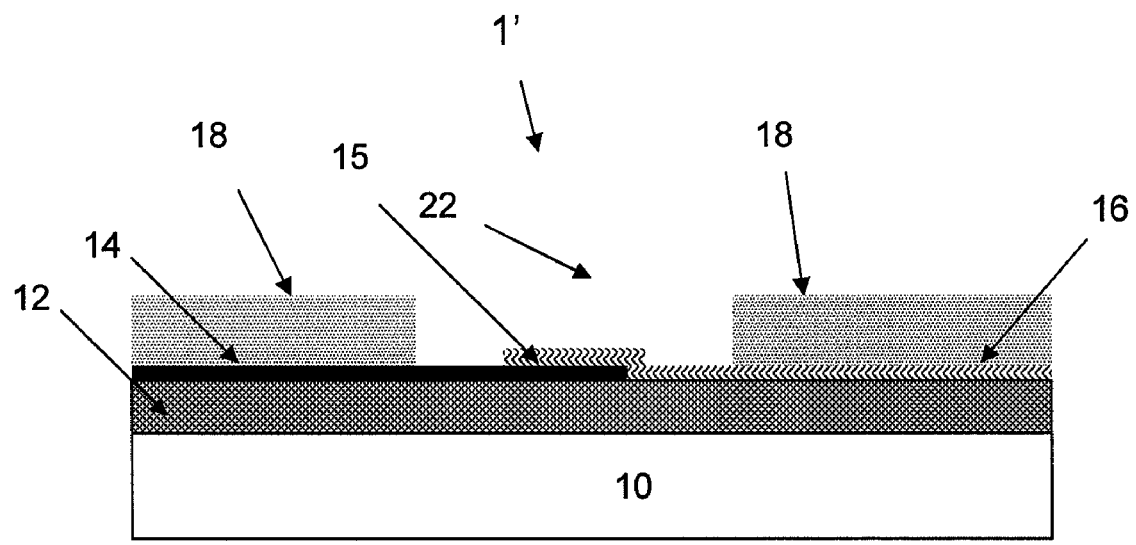
FIG. 2 shows a metal gate thermocouple in accordance with a second aspect of the invention.

FIG. 2 shows a second aspect of the thermocouple in accordance with the present invention. The thermocouple is generally shown at reference numeral 1'. As with the thermocouple of the first embodiment, the thermocouple 1' can be fabricated using BULK or SOI technology. In one aspect of the invention, the thermocouple 1' is fabricated on a thin oxide layer 12 deposited on silicon 10. In another embodiment, the thermocouple 1 is fabricated on a conventionally formed shallow trench isolation (STI) structure, formed in silicon 10. Accordingly, reference numeral 12 can equally depict a thin oxide layer or an STI structure.

Still referring to FIG. 2, a first metal (conductor) layer 14 is deposited on the layer 12. The first metal layer 14 may be, for example, Tantalum Nitride, Titanium Nitride, Tungsten, or Aluminum Titanium Nitride. The first metal layer 14 may also be doped with other metals such as, for example, magnesium, arsenic or boron, to shift the work function of the metal. The first metal layer 14 may also be a doped polysilicon or any type conductor. The first metal layer 14 may be about 5 nm to 50 nm in thickness.

A second metal (conductor) layer 16 is deposited on the layer 12 and overlaps with the metal layer 14. The overlap between the first metal layer 14 and the second metal layer 16 results in a thermocouple junction 15. In embodiments, the thermocouple junction 15 is at least more than an alignment tolerance. For example, in embodiments, the thermocouple junction 15 (e.g., overlap of the first metal layer 14 and the second metal layer 16) is about 2 nm; although this junction may be upwards of 500 nm, in certain embodiments. The result of a larger junction is a lower noise measurement, but the necessity for a larger power requirement.

The second metal layer 16 may be, for example, Tantalum Nitride, Titanium Nitride, Tungsten, or Aluminum Titanium Nitride. The second metal layer 16 may also be doped with other metals such as, for example, magnesium, arsenic or boron, to shift the work function of the metal. The second metal layer 16 may also be a doped polysilicon or any type conductor. The second metal layer 16 may be about 5 nm to 50 nm in thickness. The first metal layer 14 and the second metal layer 16 should not be the same metals, when deposited on the structure of the present invention.

In further embodiments, a polysilicon layer 18 is deposited over the first metal layer 14 and the second metal layer 16 in a conventional manner. For example, the polysilicon layer 18 may be deposited using conventional chemical vapor deposition (CVD) processes or plasma enhanced CVD processes (PECVD). In embodiments, using conventional masking processes, the polysilicon layer 18 may be doped using conventional dopants. For example, the polysilicon layer 18 can be doped with arsenic on an NFET side of the device and boron on a PFET side of the device. The thickness of the polysilicon layer 18 is about 15 nm to 300 nm. As an alternative to the doped polysilicon layer 18, a metal layer can be formed over the metal layer 14 and metal layer 16.

As shown in FIG. 2, the polysilicon layer over the thermocouple junction 15 is removed as designated with reference numeral 22. In the alternative embodiment, the metal layer would also be removed. This forms a non-conductive void 22 over the thermocouple junction 15. In further embodiments, the distance between the doped polysilicon layer 18 and an edge of the thermocouple junction 15 (on both sides) is about 2 nm to 500 nm.

Figure 3:
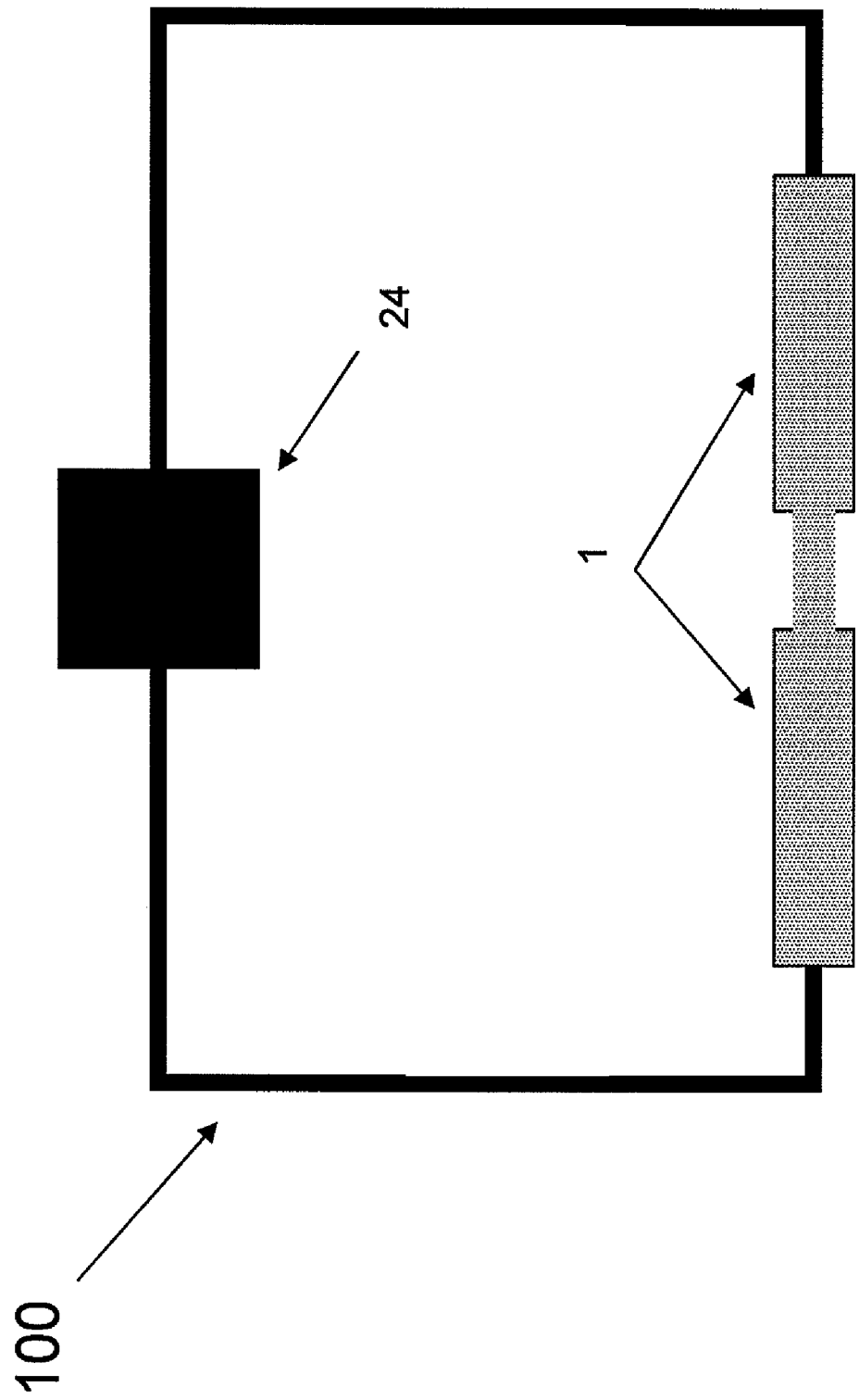
FIG. 3 shows a circuit using the metal gate thermocouples of the present invention.

FIG. 3 shows an exemplary circuit implementing either aspect of the invention. More specifically, the circuit 100 shows two thermocouple devices in accordance with the invention, in series. It should be noted that the thermocouple devices are coupled to like metals. For example, a titanium metal layer on a first thermocouple device would be coupled to a titanium metal layer on a second thermocouple device. The second metal layers of both of the thermocouple devices would be connected to a measuring circuit 24.

In embodiments, the first thermocouple device would be at a reference temperature of a die. In embodiments, the reference temperature would be the coldest expected location on the die. The second thermocouple device would be positioned at a location where there should be a temperature rise, e.g., at a location which temperature is to be measured. The temperature differential of the thermocouple devices is calculated by measuring the output voltages. As should be understood by those of skill in the art, the relationship between the temperature difference and the output voltage of a thermocouple is nonlinear and is approximated by quadratic polynomial:

$$T = \sum_{n=0}^{N} a_n v^n$$

The coefficients $a_n$ are given for n from zero to two. To achieve accurate measurements the equation is usually implemented in a digital controller or stored in a look-up table.

While the invention has been described in terms of exemplary embodiments, those skilled in the art will recognize that the invention can be practiced with modifications and in the spirit and scope of the appended claims.

What is claimed is:

1. An integrated circuit comprising:
   at least one thermocouple, comprising:
   a first conductor comprising a first material formed in direct contact on a thin oxide layer or a shallow trench isolation (STI) structure;
   a second conductor comprising a second material formed in direct contact on the thin oxide layer or the STI structure, the second conductor overlapping and in direct contact with the first conductor to form a thermocouple junction having a thickness that comprises the first conductor and the second conductor and which is of a dimension at least more than an alignment tolerance; and
   a conductive film formed in direct contact on the first conductor and the second conductor and a non-conductive void or film formed in direct contact on the thermocouple junction and extending beyond the thermocouple junction to edges of the first conductor and the second conductor by at least the alignment tolerance, wherein the thermocouple junction are formed by two different metals which have a non-zero Seebeck coefficient,
   wherein the film comprises polysilicon and the conductive film is doped polysilicon, and
   wherein the polysilicon covers the thermocouple junction and is nearly intrinsic above the junction.

* * * * *